United States Patent [19]

Kim et al.

[11] 4,038,157
[45] July 26, 1977

[54] METHOD OF HERMETICALLY SEALING SEMICONDUCTOR DEVICES

[75] Inventors: Chung K. Kim, Lexington, Mass.; Yung L. Cho, Hauppauge, N.Y.

[73] Assignee: The United States of America as represented by the Secretary of the Air Force, Washington, D.C.

[21] Appl. No.: 677,589

[22] Filed: Apr. 16, 1976

[51] Int. Cl.² .......................... C25D 5/10; C25D 5/54
[52] U.S. Cl. .......................................... 204/16; 204/30
[58] Field of Search ................................ 204/16, 20, 30

[56] References Cited

U.S. PATENT DOCUMENTS

| 227,370 | 5/1880 | Man | 204/16 |
| 1,090,456 | 3/1914 | Darrah | 204/16 |
| 2,980,829 | 4/1961 | Lawson | 204/16 |
| 3,932,227 | 1/1976 | Rothenberg | 204/16 |

FOREIGN PATENT DOCUMENTS

| 1,195,143 | 6/1965 | Germany | 204/16 |

*Primary Examiner*—T. M. Tufariello
*Attorney, Agent, or Firm*—Joseph E. Rusz; George Fine

[57] ABSTRACT

A method of hermetically sealing semiconductor devices utilizes a dielectric tube with a two step structure at one end. The tube is used to surround a semiconductor. The two step end of the tube is metallized. The other end of the tube is flat and is brazed onto a metal stud so that the semiconductor is in the center of the brazed joint. A metal lid is painted with a conductive material and then placed into a rim formed by the two step end. When the paint dries, a metal layer is electrodeposited at the top of the lid and tube.

2 Claims, 4 Drawing Figures 4,038,157

METHOD OF HERMETICALLY SEALING SEMICONDUCTOR DEVICES

STATEMENT OF GOVERNMENT INTEREST

The invention described herein may be manufactured and used by or for the Government for governmental purposes without the payment of any royalty thereon.

BACKGROUND OF THE INVENTION

Hermetic encapsulation of semiconductor devices is one of the most important steps in device manufacturing process for high reliability performance.

At the present time, the most widely used technique is electric-welding. The process is aimed at providing rugged and airtight seals between metallized ceramic and a metal lid (or cap).

A metal part (lid) is usually brazed onto a metal flange attached to a ceramic sleeve. This is done in a high temperature environment. The seal is accomplished by electric-welding the metal flange onto the metal lid.

It is noted that the existence of a "shoulder-out" portion of the metal flange is essential in order to perform the electric-welding; i.e., to provide the path of welding current.

However, in most microwave applications, the extended shoulder is very undesirable. The metal flange causes extreme mismatch problems between the semiconductor devices and the associated circuits. In many instances, the flange "shoulder" of individual packages must be trimmed off mechanically.

The present semiconductor package encapsulation process is essentially one of "cold" hermetic sealing. There is no "shoulder-out" or heat-induced problem in the process. The process employs two major features. The first feature is the utilization of a two step structure of the dielectric sleeve. The second is the electroforming (deposition) over the metal lid and ceramic metallization.

The present invention is hereinafter referred to as the electroplated microwave package encapsulation process. There are a multiplicity of advantages of this process over the prior art. One of the advantages is that minimum parasitics is achieved in microwave applications. Another is a high yield in hermeticity with a rugged mechanical bonding between the lid and the dielectric sleeve is obtained. Still another is that the sealing process does not involve any high temperature cycle. A further advantage is that independent of the package size, the sealing process is cost effective in large volume production.

SUMMARY OF THE INVENTION

An electroplated microwave package encapsulation process for semiconductor devices is provided. A dielectric sleeve (tube) with a two step structure at one end is used to surround the semiconductor. The two step structure forms a rim. The two step end is metallized and then the flat end of the sleeve is brazed onto a metal stud so that the semiconductor is in the center of the braze joint. A metal lid which fits into the rim of the sleeve is painted with a viscose conductive material and then placed into the rim. When the paint dries, a metal layer is electro-deposited on the top of the lid and sleeve to hermetically seal the enclosed semiconductor.

DETAILED DESCRIPTION OF THE PREFERRED EMBODIMENT

Figure 1:
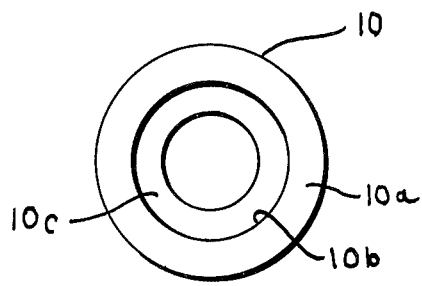
FIG. 1 shows a top view at the two step end of the dielectric sleeve.

Now referring to FIG. 1, there is shown the top view of the two step structure of the dielectric sleeve 10. The dielectric material may be ceramic or any type similar thereto. Rim 10b is formed in the two step structure by stepping down to surface 10c from top surface 10a.

Figure 2:
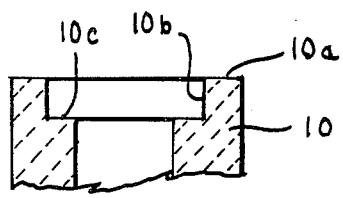
FIG. 2 shows the two step end of the dielectric sleeve.

Now referring to FIG. 2 which is a side view of the two step structure, there is shown dielectric sleeve (or tube) 10 having top surfaces 10a, rim 10b, and lower surface 10c. The two step structure consisting of top surface 10a, the surface of rim 10b, and lower surface 10care metallized with Mo/Mn alloy or platinum.

Figure 3:
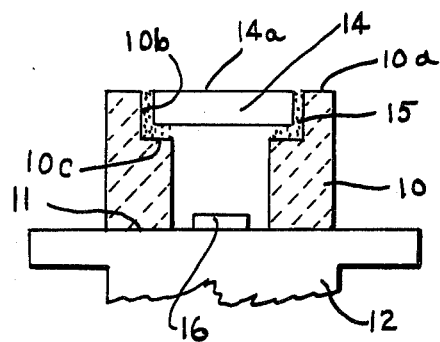
FIG. 3 shows the metal stud brazed to the flat end of the sleeve and the metal lid positioned in the rim formed by the two step end.

Referring to FIG. 3, there is shown dielectric sleeve 10 in the entirety. It is noted that the aforementioned metallization may include the entire outer surface of dielectric sleeve 10 including the outer surface of flat end 11. Metallized flat end 11 is brazed into metal stud 12. Metal lid 14 is "painted" with viscose conductive material 15. The viscose conductive material may be silver epoxy or a similar type. Metal lid 14 is made so as to fit tightly into the two step structure. The aforementioned step may also be accomplished by painting the outer surface of rim 10b and lower surface 10c and then positioning therein metal lid 14. Outer surface 14a of of metal lid 14 and outer surface 10a of the two step structure are flush with each other. It is noted that semiconductor 16 is in the center of the braze joint.

Figure 4:
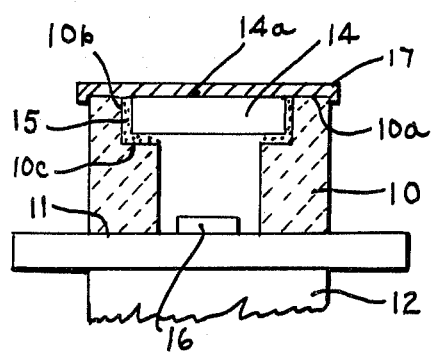
FIG. 4 shows the electro-deposited layer on the lid and the top surface of the two end step structure to complete the process of the present invention.

Referring now to FIG. 4, there is electro-deposited metal layer 17 on outer surface 14a of metal lid 14 and outer top surface 10a of the two step structure after the "paint" is hardened. Gold barrel plating may be followed for final gold finishing on the entire metal surface exposed to air.

What is claimed is:

1. An electroplated microwave encapsulation process for a semiconductor being comprised of the step of forming a dielectric sleeve of ceramic for microwave utilization having an inner and outer circumference, a two step structure at one end and a flat surface at the other end, the two step structure having the first step thereof extending partially outwardly from the inner circumference toward the outer circumference of the dielectric sleeve, the first and second step being interconnected to form a rim, the step of metallizing with platinum the surfaces of the two step structure, the flat end of the dielectric sleeve and the outer circumference of the dielectric sleeve, the step of brazing the metallized dielectric flat end onto a metal stud in the form of a brazed joint with said semiconductor being positioned in the center of the brazed joint, painting the surface of the first step and the rim with a viscose conductive material, placing a metal lid having a top surface with said first step and fitting tightly into said rim, said top surface of said metal lid and said second step providing a flush surface, the step of electroforming a metal layer on said flush surface after the hardening of said viscose conductive material, and the step of gold barrel plating for final gold finishing on the entire metal surface exposed to the air.

2. An electroplated microwave encapsulation process as described in claim 1 wherein the covering of the surfaces of the first step and the rim includes a viscose conductive of silver epoxy.

* * * * *